US005521499A

United States Patent [19]
Goldenberg et al.

[11] Patent Number: 5,521,499
[45] Date of Patent: May 28, 1996

[54] SIGNAL CONTROLLED PHASE SHIFTER

[75] Inventors: Yoav Goldenberg, Kiryat Haim, Israel; Shimon Gur, San Diego, Calif.

[73] Assignee: Comstream Corporation, San Diego, Calif.

[21] Appl. No.: 994,931

[22] Filed: Dec. 23, 1992

[51] Int. Cl.$^6$ .................... H03H 11/16; H03H 11/26; H03K 3/00

[52] U.S. Cl. .................... 327/237; 327/241; 327/263; 327/244; 327/261; 327/284; 327/286; 327/291; 327/293

[58] Field of Search .................... 307/595, 597, 307/602, 603, 605, 606, 265, 269, 262, 241–244, 445; 328/55, 66, 155, 63, 72, 104, 133, 154; 327/237, 241, 243, 244, 261, 284, 286, 291, 293

[56] References Cited

U.S. PATENT DOCUMENTS

| | | | |
|---|---|---|---|
| 3,502,994 | 3/1970 | Ott et al. | 328/55 |
| 3,622,809 | 11/1971 | Williams | 328/55 |
| 3,817,582 | 6/1974 | Green et al. | 307/262 |
| 4,023,110 | 5/1977 | Oliver | 328/109 |
| 4,103,349 | 7/1978 | Marmet | 307/243 |
| 4,494,021 | 1/1985 | Bell et al. | 307/591 |
| 4,496,861 | 1/1985 | Bazes | 307/602 |
| 4,618,788 | 10/1986 | Backes et al. | 307/603 |
| 4,623,805 | 11/1986 | Flora et al. | 307/606 |
| 4,637,018 | 1/1987 | Flora et al. | 371/1 |
| 4,677,499 | 6/1987 | Shirota et al. | 358/339 |
| 4,721,905 | 1/1988 | Mehrgardt | 328/133 |
| 4,737,670 | 4/1988 | Chan | 307/602 |
| 4,754,164 | 6/1988 | Flora et al. | 307/269 |
| 4,755,704 | 7/1988 | Flora et al. | 307/269 |
| 4,825,109 | 4/1989 | Reynolds | 307/601 |
| 4,845,390 | 7/1989 | Chan | 307/603 |
| 4,894,626 | 1/1990 | Kubinec | 333/101 |
| 5,033,066 | 7/1991 | DeVore | 328/55 |
| 5,036,529 | 7/1991 | Shin | 375/119 |
| 5,049,766 | 9/1991 | van Driest et al. | 307/603 |
| 5,073,733 | 12/1991 | Tanno et al. | 307/602 |
| 5,073,905 | 12/1991 | Dapper et al. | 375/106 |
| 5,103,446 | 4/1992 | Bazes . | |
| 5,172,395 | 12/1992 | Dapper et al. | 375/99 |
| 5,173,617 | 12/1992 | Alsup et al. | 327/147 |
| 5,218,314 | 6/1993 | Efendovich et al. | 328/155 |
| 5,237,224 | 8/1993 | DeLisle et al. | 307/602 |
| 5,237,554 | 8/1993 | Senshu et al. | 369/59 |
| 5,243,599 | 9/1993 | Barrett et al. | 307/243 |
| 5,282,210 | 1/1994 | Slegel et al. | 307/243 |
| 5,311,519 | 5/1994 | Getzlaff et al. | 307/445 |

FOREIGN PATENT DOCUMENTS

| | | |
|---|---|---|
| 0575058A1 | 12/1993 | European Pat. Off. . |
| 0576150A2 | 12/1993 | European Pat. Off. . |
| 0575059A1 | 12/1993 | European Pat. Off. . |
| 72 00790 | 8/1973 | France . |
| 2589651 | 5/1987 | France . |
| 85 16388 | 5/1987 | France . |
| 1366472 | 9/1974 | United Kingdom . |
| 2233177 | 1/1991 | United Kingdom . |

OTHER PUBLICATIONS

Guo, et al, "TA 6.3: A 125 Mbs CMOS All–Digital Data Transceiver Using Synchronous Uniform Sampling," 1994 IEEE International Solid–State Circuits Conference, Feb. 17, 1994, San Francisco, CA.

*Primary Examiner*—David C. Nelms
*Assistant Examiner*—Trong Phan
*Attorney, Agent, or Firm*—Lowe, Price, LeBlanc & Becker

[57] ABSTRACT

A clock is phase shifted by an amount controlled by the value of a control signal by establishing at least several discrete delay times to be imposed on the clock. The control signal value controls selection of the imposed discrete delay time. An analog-to-digital converter of a phase locked loop responds to intelligence representing variable phase bits and the selected phase shifted clock to control the signal value. The selected replica is derived by at least several cascaded substantially equal time delay units. In one embodiment, a multiplexer responds to the clock, and the signal value, which is Gray coded, to control connections from one of the delay units to an output terminal. In another embodiment, the number of cascaded delay units interposed between the clock and an output terminal is controlled by the signal value.

42 Claims, 4 Drawing Sheets

SIGNAL CONTROLLED PHASE SHIFTER

BACKGROUND OF THE INVENTION

1. Field of Invention

The present invention relates generally to signal controlled phase shifters and more particularly to a phase shifter including at least several delay elements having connections to an output terminal controlled in response to the value of a control signal.

The invention is also related to a signal multiplexer responsive to at least several signals and more particularly to such a multiplexer which is responsive to a reflected coded signal.

2. Description of the Related Art

Signal controlled phase shifters are usually analog devices including a variable reactance, such as a varactor, having a value controlled by the amplitude of a voltage. Such phase shifters are frequently employed in voltage controlled variable frequency oscillators, such as are employed in phase locked loops. In such applications, a fixed clock is supplied to the voltage controlled, variable frequency oscillator to derive an output frequency that is fed back to one input of a phase detector, having a second input responsive to an input frequency. The phase detector derives an error voltage that is fed to a loop filter which supplies the voltage controlled oscillator with a variable amplitude voltage for controlling the oscillator output frequency. Phase locked loops are used to lock a receiver to an incoming frequency with zero frequency or phase error. In receivers responsive to variable phase signals representing digital data, e.g. QPSK or BPSK signals, a demodulator of the receiver is locked to a symbol frequency with zero phase error. Such locking is usually performed with a first or second order phase locked loop.

The prior art analog phase shifters and analog based phase locked loops have the usual disadvantages associated with analog circuitry, i.e., lack of repetitiveness in manufacturing and performance unless "tweaking" procedures are used, low yield production, inaccuracy and the need to adapt the analog circuitry to the remaining parts of the equipment. To overcome these problems, digitally based phase locked loops have been developed. One digitally based phase locked loop responsive to base band signals to be demodulated includes an analog-to-digital converter having one input responsive to such a signal. The converter has a second input responsive to a sampling clock having a variable frequency controlled by the digital phase locked loop. The converter derives a multi-bit digital output signal having a variable value dependent on the amplitude of the base band signal when a sample derived by the clock occurs. The base band signal is subject to a full gamut of amplitude variations because of imperfections in the transmission and processing of the signal between the origination site and the phase locked loop site. Normally at least two samples of the variable phase signal are taken during each symbol.

The variable digital output signal of the converter is supplied to a symbol data decoder and error generator. The symbol data decoder and error generator derives a data output signal representing the digital value of the symbol, as well as a signal indicative of the phase error between the variable phase signal and the sampling clock. The phase error digital control signal is supplied to a symbol timing loop filter, which in turn drives a direct digital synthesizer, having a digital output signal with values representing the amplitude of a sine wave. The direct digital synthesizer drives a digital to analog converter, having a sinusoidal-like output with values equal to the digital values derived by the synthesizer. The digital to analog converter sinusoidal-like output is supplied to a lowpass filter. Direct digital synthesizers are frequency limited to a few megaHertz, so the lowpass filter output is considerably lower in frequency than the base band signal supplied to the analog-to-digital converter. To provide the analog-to-digital converter with an acceptable sampling frequency, the lowpass filter output is supplied to a frequency multiplying phase locked loop. Hence, this prior art system is relatively complex, requiring an analog phase locked loop within the digital phase locked loop, as well as a digital to analog converter and a lowpass filter.

Another prior art digitally based system for demodulating variable phase intelligence signals supplied to a receiver includes an analog-to-digital converter having first and second inputs respectively responsive to the base band signal and a fixed frequency sampling clock. The analog-to-digital converter derives a digital output having values indicative of the amplitude of the base band signal supplied to the converter at the time each sampling clock occurs. To determine the precise level of the analog-to-digital converter output signal, an interpolator responds to the converter output to find the sampled values at the desired time. The interpolator is either of the finite or infinite impulse response type. The interpolator derives a digital output which is supplied to a symbol timing processor having an output which updates coefficients used in the interpolator. The symbol timing processor also derives data representing output signals.

One further type of digitally based phase locked loop samples the amplitude of a received signal. The resulting samples are processed to derive an error control signal for the frequency of the sampling source. The error control signal controls the frequency of the sampling source by selecting one of several predetermined frequency division factors for a fixed clock source. As the error changes, the frequency division factor changes, to vary the sampling source frequency by discrete, fixed amounts. This type of phase lock loop has the disadvantage of not being suitable for high frequency sampling sources and does not provide high frequency resolution.

It is, accordingly, an object of the present invention to provide a new and improved signal controlled phase shifting apparatus and method.

Another object of the present invention is to provide a new and improved signal controlled variable frequency oscillator and to provide a method of deriving a variable frequency wave in response to a control signal.

An additional object of the invention is to provide a new and improved digitally based phase locked loop and a method of digitally phase locking an input frequency and a clock.

Still another object of the invention is to provide a digitally based phase locked loop including a digitally controlled asynchronous phase shifter responsive to a fixed frequency clock.

A further object of the present invention is to provide a digitally based phase locked loop suitable for high frequencies that is relatively inexpensive because it employs a fixed frequency oscillator reference.

SUMMARY OF THE INVENTION

In accordance with one aspect of the invention, a clock phase is discretely changed as a function of time by deriving a signal having at least several discrete changing values as a function of time. At least several discrete delay times for the clock are established. In response to the values of the signal the clock is subjected to at least several of the established discrete delay times so there is a correspondence between the discrete delay times to which the clock is subjected and the changing values of the signal so the clock, as subjected to the delays, is discretely phase shifted.

A feature of the invention is that the delay to which the clock is subjected is reset to an initial value in response to the phase of the delay subjected clock having a predetermined relation with respect to the phase of the clock prior to it being subjected to the delay.

In one embodiment, the at least several discrete delay times are established by deriving at least several delayed replicas of the clock. The delayed replicas have different discrete delay intervals relative to the clock. The delay time is changed by selecting different ones of the discrete delayed replicas in response to different values of the signal.

In another embodiment, the at least several discrete delay times are established by applying the clock to at least several delay units having discrete delay times. The delay time is changed by changing the number of the delay units to which the clock is subjected in response to different values of the signal.

In accordance with an added aspect of the invention, the phase of a periodic waveform is shifted in response to the value of a variable control signal. The phase shift is interposed between an output terminal of a source of the waveform and another output terminal. Apparatus for shifting the waveform phase comprises at least several delay units having discrete delay times. Means responsive to the value of the variable control signal controls connections of the delay units between the waveform source output terminal and the another output terminal to thereby control the delay time interposed by the delay units on the periodic waveform between the waveform source output terminal and the another output terminal.

In one embodiment, the delay units are cascaded with each other and the control means responds to the control signal for effectively controlling the number of the delay units cascaded between the source output terminals and the another output terminal. Preferably the control means selects an output of one of the delay units and couples it to the other output terminal.

In a second embodiment, 1,2 . . . N of the delay units are provided. Delay unit 1 is connected so an output thereof is connected to the other output terminal without connections through any other of the N delay units. The control means controls connections between the source output terminal and input terminals of the delay units and between adjacent delay units so that in response to the control signal having a value commanding k of said delay units to be cascaded between the source output terminal and the another output terminal the waveform at an output terminal of delay j is coupled to an input terminal of delay unit (j−1), where k is selectively any integer between 1 and N and j is selectively every integer between 1 and k.

In the second embodiment, the control means establishes a connection so the waveform at the source output terminal is coupled to an input terminal of delay element j, effectively prevents connections between the source output terminal and the input of delay elements (j−1), (j−2). . . 2,1 and establishes connections between the outputs of delay elements j, (j−i) . . . 2 and the inputs of delay elements (j−1), (j−2) . . . 1, respectively.

To minimize hardware, the control means preferably divides the N units into plural groups, the control means monotonically changes the value of k for a first group of P of the N units during a first time interval, and then monotonically changes the value of k for a second group of P of the N units during a second time interval. The control means includes a counter or register having P states. During first and second time intervals, control signals are respectively coupled from the P states to the first and second groups of P units.

In accordance with an additional aspect of the invention, a periodic input wave is phase shifted by an amount controlled by the value of a control signal by delaying the wave and deriving at least several delayed replicas thereof. Each delayed replica has a different delay interval relative to the input wave. In response to the value of the control signal, one of the delayed replicas is selected. The selected delayed replica is phase shifted relative to the input periodic wave by an amount determined by the value of the control signal.

In accordance with another aspect of the invention, an apparatus for shifting the phase of a clock in response to a control signal having a value representing a phase change to be applied to the clock comprises means responsive to the clock for deriving at least several replicas of the clock. The replicas have differing time delays with respect to each other. A means responsive to the value of the phase change representing signal couples a selected one of the replicas to an output terminal as a function of the value of the control signal.

To enable relatively inexpensive low frequency silicon based integrated circuit devices to be used for the clock, the delayed replica deriving means and the selective coupling means, the apparatus preferably includes means for setting the control signal to a predetermined value when a predetermined phase relation exists between the clock and the replica at the output terminal. The phase change representing signal is a phase correction signal derived in response to a signal representing a substantially constant frequency error between the replica at the output terminal and a reference frequency. The predetermined phase relation represents a phase change of approximately n×360° (where n is an integer including unity) of the clock phase. The predetermined value of the control signal is set to a value associated with a 0° phase change for the clock when the replica at the output terminal has a phase that differs by about n×360° from the phase of the clock. The resulting asynchronous structure operates at a much lower frequency than a synchronous circuit, which would require the use of expensive materials, such as gallium arsenide.

The apparatus is preferably included in a receiver phase locked loop including an analog-to-digital converter responsive to an intelligence representing signal having a tendency to be degraded as a result of propagation from a transmitter to the receiver. The converter derives a multi-bit digital signal representing the amplitude of the intelligence signal in response to a sampling wave train derived in response to the phase shifted clock. Means responsive to the converter derives the frequency error and phase correction representing signals. To derive the phase correction signal the phase locked loop includes means for integrating the frequency error representing signal.

In one embodiment, a counter responsive to the integrator derives the phase correction signal and is reset to 0 in response to the selected replica differing from the clock phase by about n×360°.

In the first embodiment, whenever the digital control signal changes, there are means to prevent glitches from occurring in the output of the selecting means. In this embodiment, the replica deriving means includes (N–1) cascaded substantially equal time delay elements designated 1, 2 . . . (N–1) and the means for coupling includes a multiplexer having a control input responsive to the digital control signal and N signal input terminals designated 0, 1, 2 . . . (N–1) wherein input signal terminals 0 and k are respectively responsive to the clock and the replica derived from delay element k, where k is selectively each of 1, 2 . . . (N–1).

The phase change signal is preferably reflected coded (e.g. Gray coded) and the multiplexer includes an array of (N–1) gates each having first and second signal inputs, a signal output and a control input responsive to a bit of the reflected coded signal for routing the signal at one of the two signal inputs to the signal output as a function of the bit value at the control input. The gates are connected to each other in accordance with a reflected coded decoding logic so that as the reflected coded signal advances by a count of one in base 10 (indicated by a one bit change in the reflected coded signal) there is a like progression in the number of the multiplexer signal input terminal coupled to the multiplexer signal output terminal.

In another embodiment, changes in the integrator output are detected to derive a shift signal. The shift signal controls connections between (1) the periodic waveform being phase shifted and inputs to at least several delay units and (2) outputs and inputs of delay units that are selectively cascaded together.

In accordance with an added aspect of the invention an apparatus for shifting the phase of a clock in response to a digital control signal representing a frequency correction to be applied to the clock comprises means responsive to the clock for deriving a replica of the clock that is delayed from the clock by a selected one of at least several discrete intervals. Means responsive to the frequency correction signal selects one of the discrete intervals. The frequency correction signal has a tendency to be very small and thereby changes the relative phase of the selected replica after many cycles of the clock have occurred. Means responsive to the phase of the selected replica shifting by a phase at about 360° of the clock activates the selecting means back to an initial condition associated with the selected replica having a predetermined initial phase relation with the clock.

In accordance with a further aspect of the invention a variable frequency source responsive to a periodic input wave, e.g. a clock, and a first digital control signal having a value representing changes to be made to the frequency of the periodic input wave comprises a digital integrator responsive to the first digital control signal for deriving a second digital control signal having a value commensurate with a phase shift to be imparted to the periodic input wave. A digital phase shifter responsive to the second digital control signal and the periodic input wave shifts the phase of the periodic input wave by an amount determined by the value of the second digital control signal so the digital phase shifter derives a variable frequency output wherein the frequency of the periodic input wave is shifted on the average by an amount determined by the value of the first digital control signal. The digital phase shifter comprises means responsive to the periodic input wave for delaying the wave and deriving a replica of the wave that is delayed from the wave by a selected one of at least several discrete intervals. Means responsive to the second digital control signal selects one of the discrete intervals so the delayed replica is phase shifted relative to the periodic input wave by an amount determined by the magnitude of the second digital control signal.

Another aspect of the invention is directed to a method of attaining phase lock between a constant frequency input and a clock having a frequency slightly different from the constant frequency. The method comprises sampling the value of the input at a sampling frequency and responding to the sampled value to derive a first representation having a value equal to the frequency error between the sampling frequency and the constant frequency input. The frequency of the clock is shifted by an amount determined by the value of the first representation by integrating the first representation to derive a second representation having a value commensurate with a phase shift to be imposed on the clock. The phase shift to be imposed has one of at least several different discrete values wherein adjacent ones of said phase shift values are approximately equally spaced from each other. A delay is imposed on the clock for a time directly proportional to the selected discrete value to derive the frequency shifted clock.

In the preferred embodiments, the input is sampled by converting the input into values so that a multi-bit digital value is derived each time the input is sampled.

In accordance with a further aspect, the invention is directed to a method of shifting the phase of a clock to a selected one of at least several different discrete values. A delay is imposed on the clock for a time determined by the selected discrete value to derive the phase shifted clock so that as the selected value changes the imposed delay changes. The selected value is reset to 0 in response to the imposed delay on the clock being equal to an integral multiple of about one cycle of the clock.

In accordance with a further aspect of the invention, there is provided a multiplexer capable of routing N input signals to an output terminal in response to a reflected coded signal having M bits designated as 0, 1, 2 . . . (M–1 ), where bits 0 and (M–1) are respectively the lowest and highest order bits of the reflected coded signal and $2^{(M)}=N$. Such a multiplexer comprises N input terminals designated by 0, 1, 2 . . . (N–1) and (N–1) gates each having: first and second signal inputs, a signal output and a control input responsive to a bit of the reflected coded signal for routing the signal at one of the two signal inputs to the signal output as a function of the bit value at the control input. The signal inputs, control inputs and signal outputs of the gates are connected to each other and the input terminals so that, as the reflected signal value changes from a reflected value representing the value in base 10 of i to (I+1), the signal at the output terminal changes from the signal at input terminal i to the signal at input terminal (i+1), where i is selectively each of 0, 1, 2 . . . (N–2).

Preferably, the multiplexer (N–1) gates are spatially arranged as a tree including M rows such that row r includes $N(2^{-r-1})$ gates, where r is selectively each of 0, 1, 2 . . . (M–1) and the gates of row r are responsive to bit r of the reflected coded signal.

In the preferred embodiment, the first and second inputs of gate k (where k is an even integer from 0 to (N/2–2)) in row 0 are respectively connected to be responsive to the signals at input terminals $2k$ and $(2k+1)$ while the first and second inputs of gate (k+1) in row 0 are respectively connected to be responsive to the signals at input terminals $(2k+3)$ and $2(k+1)$. The first and second inputs of gate j (where j is an even integer from 0 to $N(2^{-(r+1)}-2)$ in row r+1 are respectively connected to be responsive to the signals at the output terminals of gates $2j$ and $(2j+1)$ of row r while the first and second inputs of gate (j+1) in row r+1 are respectively connected to be responsive to the signals at the outputs of gates $(2j+3)$ and $2(j+1)$ of row r, where r is selectively each of 0 to (M–1).

Accordingly, still a further object of the invention is to provide a new and improved signal multiplexer having at least several input terminals and which is responsive to a reflected coded signal for coupling the signal at one of the terminals to an output terminal.

An added object of the invention is to provide a signal multiplexer having at least several input terminals and which is responsive to a reflected coded signal so that there is a one-to-one relationship between the base 10 values of the reflected coded signals and the signal at the selected input terminal which is coupled to the output terminal.

The above and still further objects, features and advantages of the present invention will become apparent upon consideration of the following detailed description of several specific embodiments thereof, especially when taken in conjunction with the accompanying drawings.

DESCRIPTION OF THE PREFERRED EMBODIMENT

Figure 1:
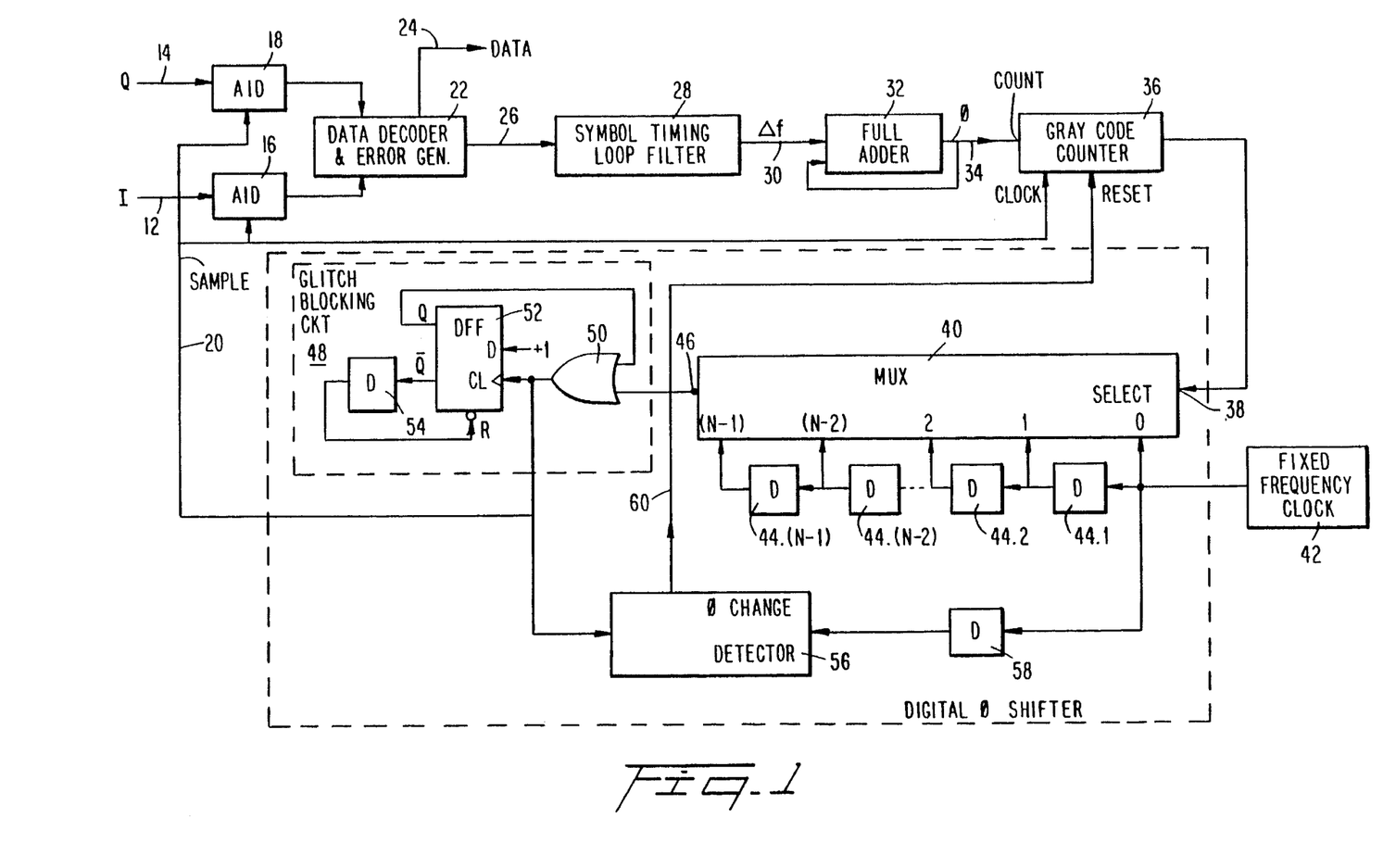
FIG. 1 is a partial block and partial circuit diagram of a phase locked loop incorporating a digitally controlled asynchronous phase shifter in accordance with one embodiment of the invention.

Reference is now made to FIG. 1 of the drawing, a phase locked loop responsive to a receiver base band quadrature phase shift key signal having I and Q components on leads 12 and 14, respectively. The signals on leads 12 and 14 are typically degraded due to the transmitting and receiving processes occurring prior to derivation of the signals on these leads so that the original variable phase I and Q channel (bi-level) amplitudes are transformed into signals having a gamut of amplitudes between a pair of levels on leads 12 and 14. A typical bit, symbol or baud rate for the signal on leads 12 and 14 is 20 megaHertz. The signals on leads 12 and 14 are respectively supplied to analog-to-digital converters 16 and 18, each of which derives a multi-bit parallel digital signal having a value commensurate with the amplitudes of the signal supplied to the converters at the time the converters are supplied with a variable frequency sampling clock via lead 20. In the usual receiver including a phase locked loop the sampling clock frequency is twice the frequency of the symbol rate of the signals on leads 12 and 14, to provide early and late gate samples, as is common in the prior art.

The output signals of converters 16 and 18 are supplied to digital data decoder and error generator 22 for deriving parallel multi-bit data and error outputs on buses 24 and 26, respectively. The error signal on bus 26 represents (digitally) the deviation of the sampling phase provided by the signal on lead 20 relative to the ideal sampling point.

The error representing signal on bus 26 is supplied to symbol timing loop filter 28 for deriving on bus 30 a parallel multi-bit digital control signal representing the frequency error associated with the error signal on bus 26. Symbol timing loop filter 28 generally derives one frequency error signal for each symbol on leads 12 and 14. The structure of converters 16 and 18, data decoder and error generator 22 and symbol timing loop filter 28 is conventional and needs no further description or explanation.

The frequency error signal derived by symbol timing loop filter 28 on bus 30 controls the frequency and phase of the sample clock on lead 20. To this end, the frequency error signal on bus 30 is converted by full adder 32, which is effectively a digital integrator, into a digital phase error signal. The overflow bit of the phase error signal is supplied to lead 34 to advance the count in reflected (preferably Gray) code counter 36, having a reflected code multibit parallel output that is supplied to select input 38 of multiplexer 40. Multiplexer 40 includes N signal input terminals, designated 0,1,2 ... (N–2) and (N–1). The N signal input terminals of multiplexer 40 are responsive to fixed frequency clock source 42 and delayed replicas thereof. Signal input terminal 0 of multiplexer 40 is directly responsive to the fixed frequency output of clock 42, while signal input terminals 1,2 ... (N–2),(N–1) are responsive to replicas that are respectively delayed by $\Delta T, 2\Delta T \ldots (N-2)\Delta T, (N-1)\Delta T$, where $\Delta T$ is a delay time.

The delayed replicas supplied to input terminals 1,2 ... (N–2),(N–1) are respectively derived from cascaded delay elements 44.1,44.2 ... 44.(N–2),44.(N–1). In a preferred embodiment, each of delay elements 44 includes a pair of cascaded unity gain inverting amplifiers; the propagation delay of the cascaded amplifiers is equal to the delay time associated with each of the delay elements. The total delay time of cascaded delay elements 44.1,44.2 ... 44.(N–2), 44.(N–1) for all possible delay times of the delay elements exceeds one cycle of fixed frequency clock 42 and for the best case the delay time is slightly in excess of one cycle of the fixed frequency clock 42. In a preferred embodiment, there are 128 ($2^7$) signal input terminals of multiplexer 40, such that N=128 and there are 127 delay elements 44.

Multiplexer 40 responds to the digital control signal at select input 38 to supply one of the delayed replicas at signal input terminals 0,1,2 ... (N–2),(N–1) to the multiplexer output terminal 46. The signal at terminal 46 is thereby a time delayed replica of fixed frequency clock source 42. The delay is commensurate with a phase shift, at the frequency of clock source 42, determined by the value of the digital control signal at terminal 38.

Because of a feedback arrangement (described infra) within the phase locked loop, the output of multiplexer 40 at terminal 46 returns to an in-phase relationship with the phase of clock 42 when the phase of the clock has been shifted through approximately one complete cycle, i.e., 360°, thereof. Because of this feedback arrangement, the phase shifter comprising multiplexer 40 and delay elements 44 is asynchronous and it is not necessary for the delay time associated with each of elements 44 to remain absolutely fixed. Hence, the propagation delay time of elements 44 can vary as a function of supply voltage, temperature and manufacturing processes. In general, the frequency of clock 42 is slightly in excess of twice the frequency of the symbol rates of the signals on leads 12 and 14. This causes the phase of the wave at terminal 46 to monotonically advance slightly over many cycles of clock 42. There is a corresponding change in the sampling frequency coupled from terminal 46 to lead 20 via glitch blocking circuit 48. The frequency error signal on bus 30 is translated by full adder 32 into a phase error signal having an overflow bit applied to lead 34. After many cycles of clock 42, there is an incremental change in the phase error signal derived by full adder 32 resulting in a monotonically changing phase input signal being supplied to terminal 38 of multiplexer 40.

The sampling clock coupled from terminal 46 to lead 20 causes a finite change in the output of filter 28 on bus 30. This results in changes in the output of full adder 34 and the input signal at select input 38 of multiplexer 40. Even if there is no change in the frequency error signal derived from loop filter 28, the output of full adder or integrator 32 changes, provided the frequency error signal derived from the loop filter has a finite, non-zero value. Thereby, the phase of the clock replica at terminal 46 monotonically changes slowly over many cycles of clock 42. Each phase change is by a discrete amount, related to the value of the signals supplied to input 38 and the delay times associated with delay elements 44. The phase at output 46 remains constant relative to the phase of clock 42 for many cycles of the clock until there is a change in the value of the signal derived by Gray code counter 36 and supplied to input 38 of multiplexer 40.

In response to the phase of the clock replica at terminal 46 being displaced by about 360°, i.e., approximately one cycle, of clock 42, Gray code counter 36 is reset to 0. In response to counter 36 being reset to 0, input 38 of multiplexer 40 is set to 0, resulting in the clock at signal input terminal of multiplexer 40 being coupled to output terminal 46. The output of multiplexer 40 is thereby in phase with the output of clock 42, to enable a new phase shift cycle to be instigated.

Whenever multiplexer 40 is switched, a glitch can be created at output terminal 46. It is very important to prevent this glitch from arriving at terminal 20. Glitch blocking circuit 48 for preventing such a glitch includes OR gate 50, D-flip-flop 52 and delay element 54. One input of OR gate 50 is connected directly to output 46 of multiplexer 40 while the OR gate output is connected to a clock input of D-flip-flop 52, while the flip-flop data (D) input is supplied with a constant binary 1 level. Clock pulses on lead 20 are supplied to a clock input of Gray code counter 36 so that the Gray code counter responds to the leading edges of the clock pulses. Flip-flop 52 includes Q and $\overline{Q}$ output terminals respectively connected to a second input of OR gate 50 and to asynchronous reset (R) input of flip-flop 52 by way of delay element 54. Delay element 54 has a delay time greater than the time required for multiplexer 40 to produce a phase change at output terminal 46 in response to a change in the value of the signal at input 38; the later time is referred to herein as the multiplexer propagation delay time.

In response to a leading edge being derived at output terminal 46 of multiplexer 40, a leading edge is derived by OR gate 50. The leading edge derived by OR gate 50 activates flip-flop 52 so the Q output thereof changes from a 0 to a 1 state, thus forcing the output of OR gate 50 to a binary 1 state. The output of OR gate 50 remains in the 1 state for a period greater than the multiplexer propagation delay. After the delay time determined by delay element 54 has elapsed, a binary 1 to 0 transition at the output of element 54 resets flip-flop 52. With flip-flop 52 activated to a reset state, the output of OR gate 50 follows transitions at output terminal 46 of multiplexer 40. A delay apparatus internal to element 54 stops resetting of flip-flop 52 by producing a binary 0 to 1 transition at the output of element 54.

The output of OR gate 50 is supplied to lead 20, to cause the signals on leads 12 and 14 to be sampled by analog-to-digital converters 16 and 18 twice during each symbol period. In addition, the output of OR gate 50 is supplied to one input of phase change detector 56, having a second input responsive to the output of clock 42, as coupled through delay element 58. Delay element 58 has a delay time equal to the multiplexer propagation delay time plus the propagation delay time of OR gate 50. When there is a change in the phase lead-phase lag relationship of the leading edges of the two inputs of detector 56, the detector derives a pulse on output lead 60 thereof; this pulse is supplied to the reset input of Gray code counter 36. Detector 56 and the circuitry associated therewith are basically detectors for a phase shift of approximately n×360° (where n is an integer including 1) of the wave at terminal 46 relative to the output wave of clock source 42.

To prevent lockup of Gray code counter 36 to a 0 state, detector 56 is prevented from deriving a second output pulse immediately after it derives a first output pulse and for an additional time thereafter until the signal at output terminal 46 has been phase shifted adequately. This result is achieved by inhibiting the output of detector 56 when the output of counter 36 has a value of 0 and values associated with a few degrees above 0°. To this end, the output of detector 56 is coupled through a gate (not shown) and the output of counter 36 is supplied to a detector (not shown) which supplies the gate with an inhibit signal when the counter output is in the range associated with phase shift values for clock 42 of 0° to as much as 340°, for a worst case situation. Because the bit rates of the signals on leads 12 and 14 can be considered constant and at a reference value which is a few kiloHertz (e.g. 7 kHz) lower than the frequency of clock 42, the phase change at output 46 of multiplexer 40 always increases in the same direction relative to clock 42 so detector 56 cannot supply a pulse to lead 60 as a result of a zero phase difference between the output of clock 42 and the signal at terminal 46.

In a preferred embodiment, multiplexer 40 is responsive to a reflected Gray coded signal having M bits, where $N=2^M$, and N is the total number of the 0,1,2 ... (N−1) inputs of the multiplexer from delay elements 44. Reflected coded signals are desirable because only one binary value thereof changes for each change of one numeral of a base 10 value. In response to a change of one binary value in the signal at input 38, multiplexer 40 selects a progressively larger or smaller signal at one of its 0, 1, 2 ... (N−2), (N−1) inputs.

In general, multiplexer 40 includes an array of (N−1) gates, each having two signal inputs (A and B) and a control input (S) responsive to a binary level for determining which of the two inputs is coupled to an output. The gates of the array are arranged in a tree, such that row 0 of the tree has N/2 gates, row 1 of the tree has N/4 gates, row 2 of the tree has N/8 gates and row r has $N(2^{-(r+1)})$ gates.

The signal inputs of the gates of row 0 are connected to signal input terminals of the multiplexer so that the even numbered gates in row 0 have inputs which are crossed with respect to the multiplexer signal input terminals, while direct connections are provided between the remaining gates of row 0 and the multiplexer signal input terminals. The outputs of the gates of row 0 are coupled to the A and B inputs of the gates of adjacent, row 1 in a similar manner. The outputs of the gates of the succeeding rows are connected to the A and B inputs of the next adjacent row in a similar manner.

In general for a multiplexer for routing N input signals to an output terminal, the A and B inputs of gate k (where k is an even integer from 0 to (N/2–2)) in row 0 are respectively connected to be responsive to the signals at signal input terminals $2k$ and $(2k+1)$ of the multiplexer while the A and B inputs of gate (k+1) in row 0 are respectively connected to be responsive to the signals at signal input terminals $(2k+3)$ and $2(k+12)$. The A and B inputs of gate j (where j is an even integer from 0 to $N(2^{-(r+1)}-2)$ in row (r+1) are respectively connected to be responsive to the signals at the output terminals of gates $2j$ and $(2j+1)$ of row r while the A and B inputs of gate (j+1) in row (r+1) are respectively connected to be responsive to the signals at the output terminals of gates $(2j+3)$ and $2(j+1)$ of row r, where r is selectively each of 0 to (M–1) and j is selectively each of 0, 1, 2 ... $N(2^{-r}1)$. The particular multiplexer array enables layout and routing of outputs from delay elements 44 to multiplexer 40 directly and between the gates within the multiplexer, with no additional crossing lines, so it is possible to achieve the same delay for all paths through the multiplexer with good accuracy.

The control inputs of the gates of row 0 are responsive to the lowest order bit derived from Gray code counter 36, the control inputs of the gates of row 1 are responsive to the next to lowest order bit derived by counter 36, etc. so the control input of the single gate of the last row (M–1) is responsive to the highest order bit derived by counter 36. Thereby in response to the reflected coded signal changing by one in base 10, there are changes to the status of all the gates in only one row of the tree.

Figure 2:
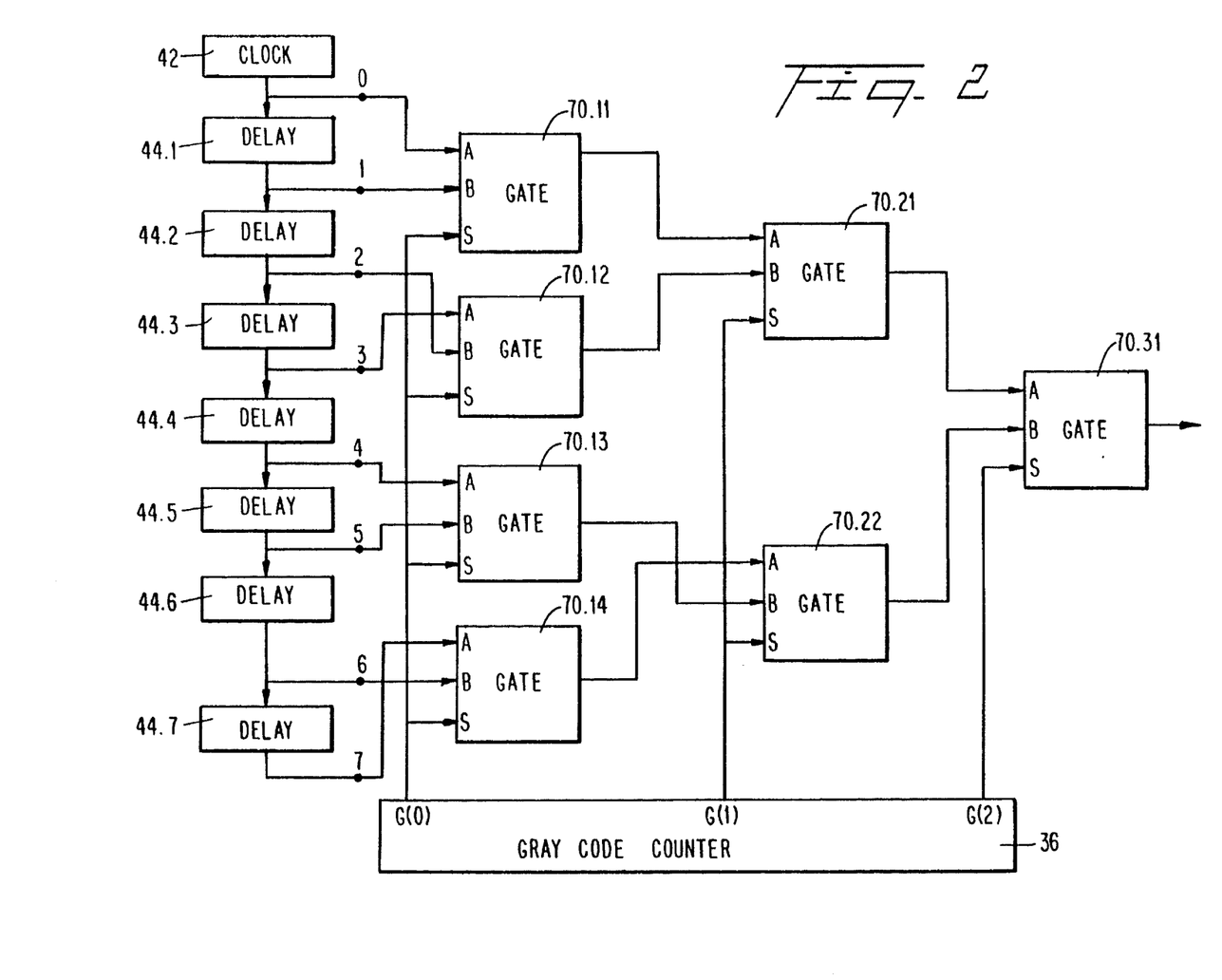
FIG. 2 is a block diagram of a preferred embodiment of the multiplexer included in FIG. 1.

A simplified version of multiplexer 40 responsive to the output of fixed frequency clock 42 and seven delayed replicas thereof and the output of Gray counter 36 is illustrated in FIG. 2. In FIG. 2, fixed frequency clock 42 drives cascaded delay elements 44.1, 44.2 ... 44.7. The output of clock 42 is applied to signal input terminal 0 of multiplexer 40, while the outputs of delay elements 44.1, 44.2 ... 44.7 are respectively applied to signal input terminals 1, 2 ... 7 of the multiplexer. For the simplified situation of FIG. 2, multiplexer 40 includes an array of seven gates, arranged in three rows, such that row 0 (the first row) includes four gates, row 1 (the second row) includes two gates and row 2 (the third, i.e., last, row) includes one gate. Hence, row 0 includes gates 70.11, 70.12, 70.13 and 70.14, row 1 includes gates 70.21 and 70.22 and row 2 includes gate 70.31.

Each of gates 70 has two signal input terminals A and B, a control signal input S and an output terminal. In response to the signal at terminal S having a binary 0 value, the signal at terminal A is coupled to the gate output terminal; in response to the signal at terminal S having a binary 1 value, the signal at terminal B is coupled to the gate output terminal. The A and B inputs of gate 70.11 are respectively responsive to the signals at multiplexer signal input terminals 0 and 1 while the A and B inputs of gate 70.12 are respectively responsive to the signals at multiplexer signal input terminals 3 and 2. A similar relationship exists for the A and B input terminals of the remaining gates of row 0 so that the A and B inputs of gate 70.13 are responsive to the signals at signal input terminals 4 and 5 of the multiplexer while the A and B inputs of gate 70.14 are respectively responsive to the signals at multiplexer input terminals 7 and 6. The S control inputs of gate 70.11–70.14 are driven in parallel by the least significant bit output of Gray code counter 36.

The S control inputs of gates 70.21 and 70.22 of row 1 are driven in parallel by the second least significant bit output of Gray code counter 36. The A and B inputs of gate 70.21 are respectively responsive to the outputs of gates 70.11 and 70.12, while the A and B inputs of gates 70.22 are respectively responsive to the outputs of gate 70.14 and 70.13.

The S control input of gate 70.31 of row 2 is responsive to the most significant bit output of the Gray code signal. The A and B inputs of gate 70.31 are respectively responsive to the outputs of multiplexer 70.21 and 70.22. For the simplified situation of FIG. 2, the multiplexer output is derived from gate 70.31.

In operation, for each one bit change in the Gray code signal supplied to gates 70, there is a one-step change of the number of the multiplexer input signal terminal coupled to the multiplexer output. Thus, for example, in response to the Gray code supplied to gate 70 having a 000 value, the output of gate 70.31 is the signal at signal input terminal 0 of the multiplexer. In this situation, all of gates 70 are activated so that the signal at the A inputs thereof are coupled to the gate output, resulting in the signal at multiplexer input terminal 0 being coupled through gates 70.11, 70.21 and 70.31 to the multiplexer output. In response to the Gray code signal advancing from 000 to 001, the signal at multiplexer input terminal 1 is coupled to the output of gate 70.31 via gates 70.11 and 70.21. In response to the Gray code signal advancing to 011, the signal at multiplexer input terminal 2 is coupled through gates 70.12, 70.21 and 70.31 to the multiplexer output. In response to the Gray code signal advancing to 010, the signal at multiplexer input terminal 3 is coupled via gates 70.12, 70.21 and 70.31 to the multiplexer output. In response to the Gray coded signal being incremented by a count of 1 from 010 to 110, the signal at multiplexer input terminal 4 is coupled through gates 70.13, 70.22 and 70.31 to the multiplexer output. In response to the Gray coded signal having a value of 111, the signal at multiplexer input terminal 5 is coupled via gates 70.13, 70.22 and 70.31 to the multiplexer output. In response to the Gray coded signal having a value of 101, the signal at multiplexer input terminal 6 is coupled via gates 70.14, 70.22 and 70.31 to the multiplexer output. Finally, in response to the Gray coded signal having a value of 100, the signal at multiplexer input terminal 7 is coupled via gates 70.14, 70.22 and 70.31 to the multiplexer output terminal. Hence, the multiplexer output advances sequentially between the signals at the multiplexer input terminals in response to each one-bit change of the Gray coded control signals supplied to gates 70. Since only one bit of the Gray coded signal can change at a time, the gates of only one row of the array change at a time.

Figure 3:
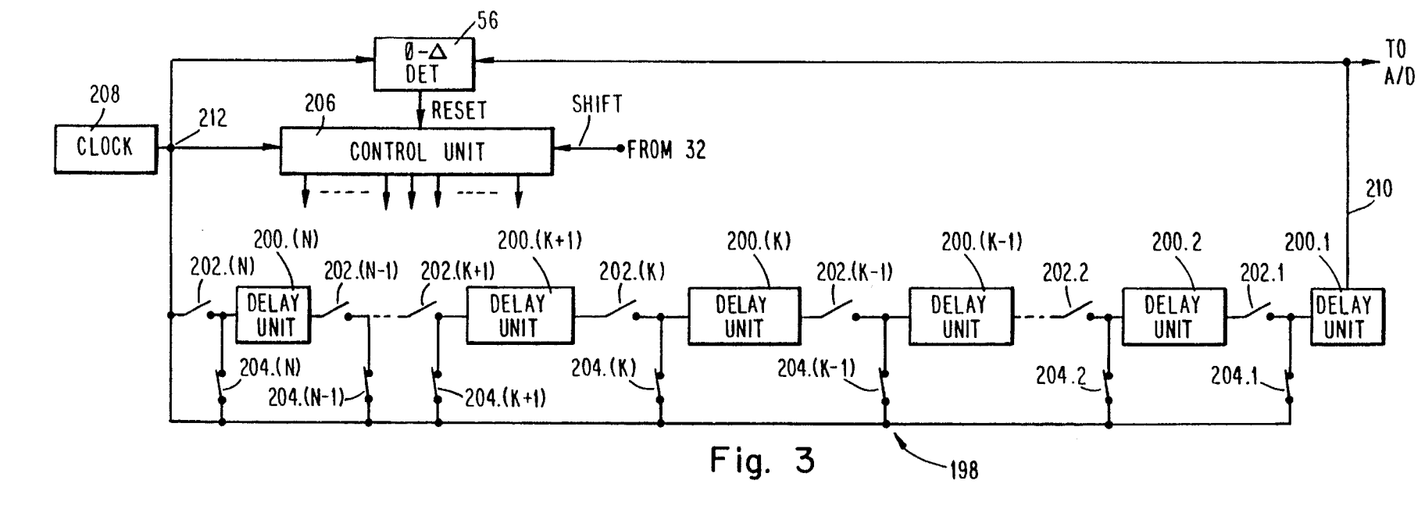
FIG. 3 is a block diagram of another embodiment of an asynchronous digitally controlled phase shifter in accordance with the present invention.

The digital phase shifter of FIG. 1 requires glitching blocking circuit 48. It is desirable under many circumstances to completely obviate the possibility for glitches to occur and, therefore, to remove glitching blocking circuit 48. To these ends, digitally controlled asynchronous phase shifter 198, FIG. 3, is provided. Phase shifter 198 replaces the entire digital phase shifter of FIG. 1 in a phase lock loop receiver. The receiver of FIG. 1 is modified by deleting Gray code counter 36 so phase shifter 198 is driven by the output of full adder 32 so the shift command input of the control unit of phase shifter 198 changes as the full adder output changes.

Phase shifter 198 can be considered as a variable frequency and phase oscillator responsive to the $\Delta f$ signal derived from loop filter 28 in a similar manner to the way the digital phase shifter of FIG. 1 functions in response to the frequency control output signal $\Delta f$ derived from loop filter 28.

The variable phase clock source illustrated in FIG. 3 includes N delay units 200.1, 200.2 ... 200.(k–1), 200.(k), 200.(*k*+1) ... 200.(N). A selected number (i) of delay units 200 are cascaded with each other and fixed frequency and phase clock source 208 by switches 202 and 204. The states of switches 202 and 204 are controlled by control unit 206 to be responsive to fixed frequency and phase clock source 208. There is a total of N switches 202 and N switches 204, such that one of switches 202 and 204 is associated with a different one of delay units 200. Hence, switches 202.1 and 204.1 are associated with delay unit 200.1, switches 202.2 and 204.2 are associated with delay unit 200.2, switches 202.(*k*) and 204.(*k*) are associated with delay unit 200.(*k*) etc. The output of delay unit 200.1 is considered as having a "zero" delay time associated with it. Switches 202 connect the various delay units 200 in series with each other while switches 204 selectively couple inputs of the delay units to the output terminal of clock source 208. Switches 202 and 204 are activated by control unit 206 so the switches associated with a particular delay unit are activated in a make before break mode.

Initially, all of switches 204 are in a closed state and all of switches 202 are in an open state. Control unit 206 responds to a shift command signal supplied to it by the output of full adder 32 (FIG. 1) and to the leading edge of the output of clock 208 to activate switches 202 and 204 so that in response to leading edge of the first clock pulse following the first shift signal, switches 202.1 and 204.1 change state to close switch 202.1 and open switch 204.1. Because all of switches 204 (and particularly switch 204.2) are closed, the make before break operation occurs. In response to the leading edge of the first clock pulse following the second shift pulse supplied to control unit 206, switches 202.2 and 204.2 respectively close and open. Operation continues in this manner so switches 202.(*k*) and 204.(*k*) respectively close and open in response to the leading edge of the first clock pulse after shift pulse k is applied to control unit 206. Control unit 206 is reset to 0, to reinitiate the initial condition state previously mentioned, in response to a reset output being derived by phase change detector 56. Switches 202, once closed, remain closed while switches 204, once opened, remain open until control unit 206 is reset by the output of detector 56, which occurs when the wave train at output terminal 210 has been shifted by slightly more than one cycle of the frequency of clock 208, as derived at the clock output terminal 212.

In the initial condition state of the apparatus illustrated in FIG. 3, one delay unit 200.1 is effectively in the circuit so there is a slight, fixed change in phase of the waveform derived by source 208 between output terminal 212 of the source and output terminal 210. In response to shift pulse 1 being supplied to control unit 206, the delay of delay unit 200.2 is interposed and the phase of clock source 208, as coupled to terminal 210, is modified accordingly.

In response to shift pulse k being supplied to control unit 206, the delays of delay units 200.1, 200.2 ..., 200.(*k*) and 200.(*k*+1) are interposed between the output of fixed clock 208 and terminal 210, so that there is a phase shift of about (*k*+1)ΔT, where ΔT is the approximately equal delay time of each of delay units 200. The delay times of units 200 are approximately equal to each other but are not exactly equal to each other because of manufacturing tolerances of the delay units and variations which occur in the delay units with and during use. The total delay time of delay units 200.1–200.(N) is slightly more than the period of one cycle of fixed clock source 208. Under most circumstances, control unit 206 is reset by the output of detector 56 prior to switch 202.(N) being activated from its normally open to its normally closed state and switch 204.(N) being activated from its normally closed to its normally open state.

Figure 4:
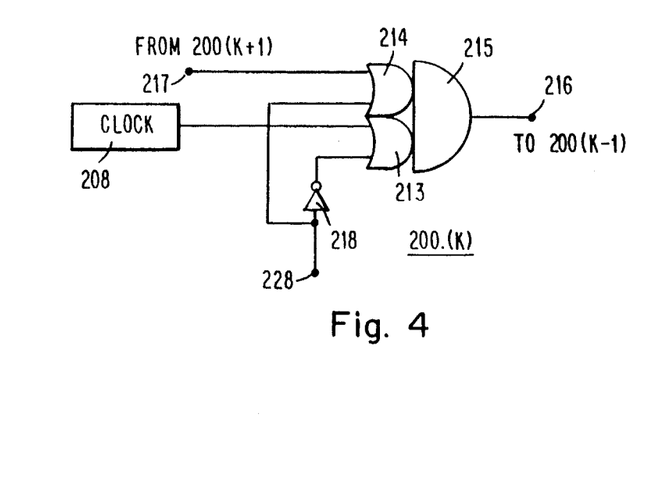
FIG. 4 is a schematic diagram of a delay unit included in the structure illustrated in FIG. 3.

Reference is now made to FIG. 4 of the drawing, a schematic diagram of a single delay unit 200.(k) of cascaded delay units 200.1–200.(N). Delay unit 200.(*k*) includes OR gates 213 and 214, having outputs supplied to inputs of AND gate 215. (Actually gates 213–215 are formed as a single integrated circuit OR-AND gate on a semiconductor chip; all of the delay units illustrated in FIGS. 1 and 3 are integrated circuits on a semiconductor chip.) AND gate 215 includes output terminal 216 connected directly to an input of the OR gate of delay unit 200.(*k*–1) corresponding with a similar input of OR gate 214 of delay unit 200.(*k*). Similarly, one input of OR gate 214 of delay unit 200.(*k*) is connected to the output terminal of delay unit 200.(*k*+1) corresponding with output terminal 216 of delay unit 200.(*k*+1). OR gates 213 and 214 are driven by complementary versions of the signal at terminal 228, which is derived from an output of control unit 206 associated with delay unit 200.(*k*). These complementary inputs actually implement the symbolic switches 202(*k*) and 204(*k*) of FIG. 3, such that the inputs OR gates 213 and 214 respectively implement switches 204(*k*) and 202(*k*). The signal at terminal 228 is supplied directly to an input of OR gate 214 and to an input of OR gate 213 via inverter 218. A second input of OR gate 213 is responsive to the output of clock 208.

The propagation delay of OR gates 213 and 214, in combination with the propagation delay of AND gate 215, provides the delay of unit 200.(*k*) between output terminal 217 of delay unit 200.(*k*+1) and the input to delay unit 200.(*k*–1), at terminal 216. A similar propagation delay is provided by delay unit 200.(*k*) for clock 208 between the input of OR gate 213 and terminal 216. The structure of gates 213–215, as an OR-AND gate, provides symmetrical delay times for the leading and trailing edges of pulses supplied to delay unit 200.(*k*).

In response to the signal from control unit 206 at terminal 228 having a binary 0 value, OR gate 213 derives a binary 1 output to enable AND gate 215 to be responsive to transitions at the output of OR gate 214. The outputs of gates 213 and 214 are thereby insensitive to pulses from clock source 208. Under these conditions, OR gate 214 responds to binary 1 to 0 transitions at the output of the AND gate of delay unit 200.(*k*+1) corresponding with output 216 of AND gate 215. Thereby, while the signal level at terminal 228 of delay unit 200.(*k*) is at a 0 level, binary 0 to 1 transitions in the output of delay unit 200.(*k*+1) are propagated to output 216 of AND gate 215 and to the input of delay unit 200.(*k*–1) with a delay time equal to the delay time of delay unit 200.(*k*).

In contrast, in response to the level at terminal 228 being a binary 1, the output of AND gate 215 is a replica of the signal from clock source 208. This is because gate 214 is set at a binary 1 level while the output of control unit 206 is a binary 1 level to enable AND gate 215 to be responsive to transitions at the output of OR gate 213 and to prevent coupling of transitions in the signal at terminal 217 through OR gate 214 to AND gate 215. Under these conditions, the output of OR gate 213 is a replica of the output of clock 208. Thereby, output 216 of AND gate 215 is driven to the binary 1 state in response to binary 1 levels being derived from clock source 208. The binary 1 pulses at terminal 216 occur at a time that is delayed from the occurrence time of the clock pulses at the input of gate 213 by the propagation time of delay unit 200.(*k*).

The most straightforward approach for implementing control unit 206 is to provide a separate control stage for each of delay stages 200.1–200.(N). Since there is a large number of delay units, with N being a number such as 64, 128 or 256, such an approach uses excessive amounts of hardware. To reduce the amount of hardware to manageable levels, delay units 200.1–200.(N) are divided into a number of groups, each including the same number of delay units. In the specifically described embodiment, 16 delay units are included in each group and a total of four groups is included so N=64.

The delay units 200 in a particular group are activated in sequence, starting with the lowest number delay unit of a particular group and proceeding to the highest number unit of the group. Thus, for example, in the first group, switches 202.1–202.16 are sequentially closed, interspersed with sequential opening of switches 204.1–204.16. While switches 202.1–202.16 and 204.1–204.16 are being sequentially activated, the remaining switches associated with delay units 200.17–200.(N) are also opened and closed in sequence. Operation of the switches of delay units 200.17–200.(N) while the switches of delay units 200.1–200.16 are being operated has no effect on the delay interposed between terminals 212 and 210 because switch 202.16 is open during the transitions in the states of switches 202.1–15 and 204.1–15. When switches 202.16 and 204.16 are closed and opened, respectively, it is guaranteed that switches 202.17 and 204.17 are respectively open and closed. After switches 202.1–202.16 and 204.1–204.16 have been sequentially activated, the same structure of control unit 206 that controlled the switches of delay units 200.1–200.16 is used to sequentially close switches 202.17–202.32, interspersed with opening of switches 204.17–204.32. Switches 202.1–16 remain in a static closed state while switches 204.1–16 remain in a static open state. Switches 202.1–16 and 204.1–16 remain in a static state and then the switches of delay units 200.1–200.32 remain in a static state and the switches of delay units 200.33–200.48 are sequentially activated. Operation continues in this manner until phase change detector 56 derives a reset pulse, at which time control unit 206 is activated back to an initial condition.

Figures 5, 6:
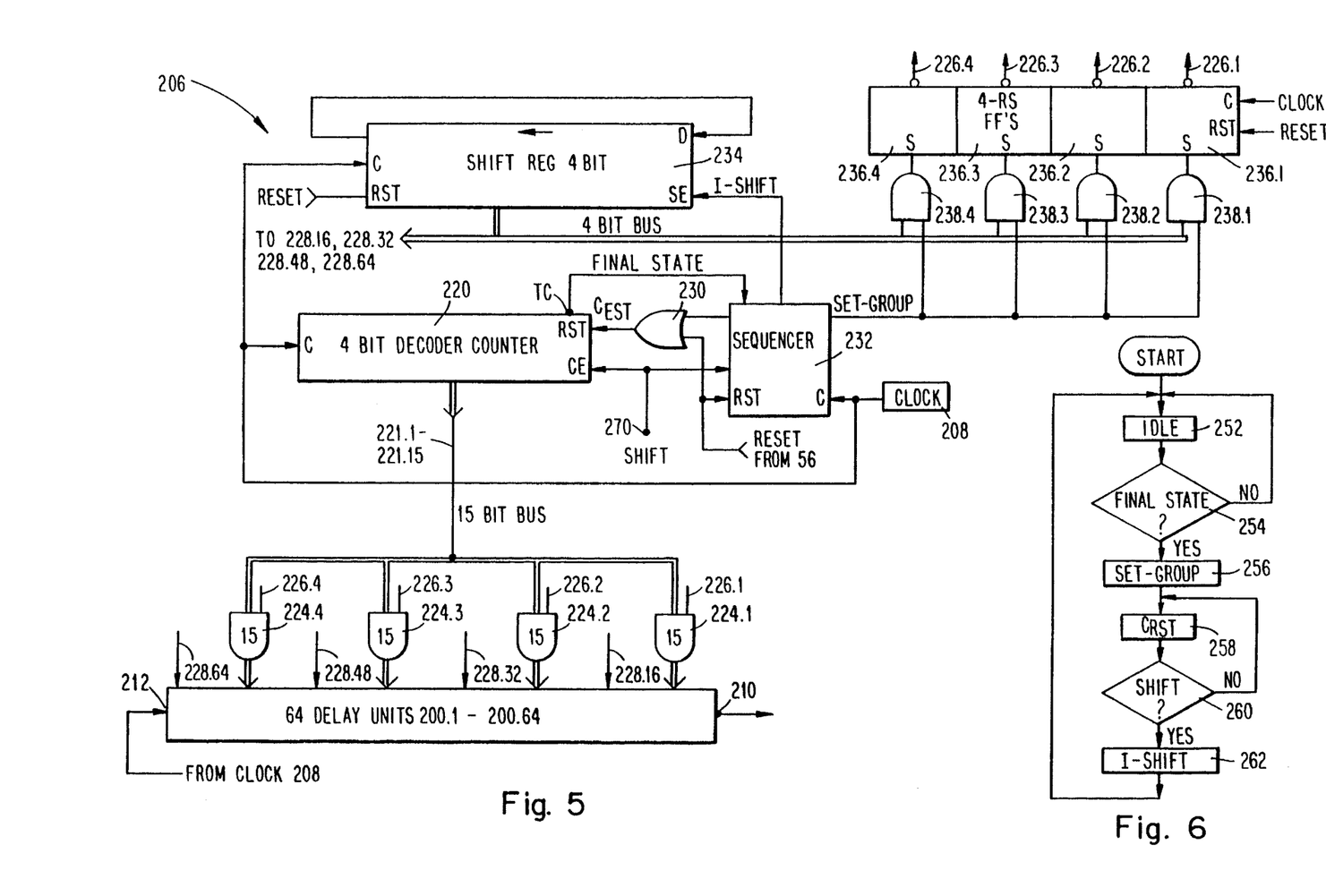
FIG. 5 is a circuit diagram of a controller included in FIG. 3.
FIG. 6 is a flow diagram of a sequencer included in FIG. 5.

FIG. 5 is a schematic diagram of control unit 206 including four-bit, glitch-free decoded counter 220, e.g., a Gray code counter, AND gates 224.1–224.4, sequencer 232, four bit feedback shift register 234, synchronous set-reset flip-flops 236.1–236.4, and AND gates 238.1–238.4, all interconnected to control 64 delay units 200.1–200.64. Pulses from clock source 208 are supplied to clock inputs (C) of counter 220, sequencer 232, shift register 234 and flip-flops 236.1–236.4. Shift input pulses are supplied to count enable (CE) input of counter 220 and from sequencer 232 to the shift enable (SE) input of shift register 234. While thus enabled, counter 220 and shift register 234 respond to the leading edges of pulses from clock source 208 to increment the counter count and the shift register state.

Counter 220 has a decoded 15 bit output bus including lines 222.1–222.15. In the reset condition, all of lines 222.1–222.15 have binary one values thereon. One to zero transitions are sequentially supplied, in order, to lines 222.1–222.15 in response to 15 sequential shift pulses supplied to control unit 206 through terminal 270. Counter 220 is sequenced from state 0 to state 15 in response to 15 sequential shift pulses being applied to the count enable (CE) input thereof, followed by a pulse from clock 208 being applied to the clock (C) input of the counter. Because of the frequency offset between the output of clock 42 (equivalent to clock 208 in FIG. 3) and the frequency of the information supplied to input lines 12 and 14 (FIG. 1), there is a monotonic increase in the value of full adder 32, resulting in sequential, somewhat constant frequency shift output pulses on lead 34. Hence, there is a somewhat constant frequency change in the output of counter 220 on lines 222.1–222.15.

Lines 222.1–222.15 are supplied in parallel to inputs of gate arrays 224.1–224.4, each of which is associated with one of the four groups of delay units 200.1–200.64; each of gate arrays 224.1–224.4 includes 15 AND gates, one for each of delay units 200.1–200.15, 200.17–200.31, 200.33–200.47, and 200.49–200.63. AND gates 224.1–224.4 are disabled in response to binary 0 levels that are sequentially applied to the remaining input of each of the gates on leads 226.1–226.4, respectively.

Initially, flip-flops 236.1–236.4 are activated so a binary 1 level is derived on each of leads 226.1–226.4, to enable all of AND gates 224.1–224.4. In response to 16, 32, 48 and 64 shift pulses being supplied to controller 206 via terminal 270, the levels on leads 226.1–226.4 respectively change from 1 to 0 to sequentially disable AND gates 224.1–224.4. To these ends, each of AND gates 224.1–224.4 has a 15 bit output bus; each of the 15 bits is coupled to one of 15 different input terminals, each corresponding to terminal 228 of delay unit 200.(k) (FIG. 4). The separate bits of the 15 bit output buses of gates 224.1, 224.2, 224.3 and 224.4 are respectively connected to inputs corresponding to terminal 228 of delay units 200.1–200.15, 200.17–200.31, 200.33–200.47 and 200.49–200.63. Input terminals 228 of delay units 200.16, 200.32, 200.48 and 200.64 respectively respond to binary levels on leads 228.16, 228.32, 228.48 and 228.64, in turn responsive to binary levels loaded into the four stages of feedback shift register 234. Initially, shift register 234 is loaded with 0001 levels on leads 228.64, 228.48, 228.32 and 228.16, respectively. In response to every I-shift, the initially loaded binary one level shifts so it is sequentially applied to leads 228.16, 228.32, 228.48 and 228.64.

Counter 220 includes a reset input (RST), responsive to the reset output of phase change detector 56, as coupled through OR gate 230. OR gate 230 is also responsive to a reset output of programmed sequencer 232, that is advanced in response to pulses from clock source 208 and has a reset (RST) input responsive to the reset output of phase change detector 56.

Sequencer 232 includes an input from terminal TC of counter 220, having a binary 1 value in response to the counter being in the final state thereof. In the final state of counter 220, a binary 0 is applied to all of leads 221.1–221.15. Sequencer 232 also responds to the shift pulses at terminal 270. Sequencer 232 responds to the inputs thereof to derive output signals for controlling the application of pulses to leads 226.1–226.4, as well as to leads 228.16, 228.32, 228.48 and 228.64. To these ends, sequencer 232 supplies "I shift" pulses to shift enable (SE) input of shift register 234 and selectively feeds "set-group" pulses in parallel to set inputs of set-reset flip-flops 236.1, 236.2, 236.3 and 236.4 via AND gates 238.1, 238.2, 238.3 and 238.4, respectively. AND gates 238.1–238.4 are also respectively responsive to outputs from the four stages of shift register 234 so leads 228.16, 228.32, 228.48 and 228.64 are respectively connected to gates 238.1, 238.2, 238.3 and 238.4.

Shift register 234 is activated so stages 1–4 thereof are sequentially loaded with binary ones to sequentially enable gates 238.1–238.4 so the "setgroup" output pulses of sequencer 232 are sequentially applied to the set (S) input terminals of flip-flops 236.1–236.4. This causes sequential binary 1 to 0 transitions on leads 226.1–226.4. All of flip-flops 236.1–236.4 are simultaneously reset to a 0 state in response to the reset output of phase change detector 56. Because leads 226.1–226.4 are connected to the inverting output terminals of flip-flops 236.1–236.4, binary ones are on leads 226.1–226.4 when the flip-flops are reset.

The last stage of four bit feedback shift register 234 is coupled back to the data (D) input of the shift register. Shift register 234 is activated to an initial condition in response to the reset output of phase change detector 56. In the reset condition, a binary 1 is in the first stage of shift register 234 and the remaining stages thereof are in a binary 0 state. Shift register 234 includes a shift enable (SE) input responsive to the I-shift output of sequencer 232 and an input clock terminal (C) responsive to the output of clock 208. Shift register 234 is constructed and responds to the inputs thereof so that the binary 1 in the first stage thereof is shifted to stages 2, 3 and 4 in response to 16, 32, 48 and 64 shift pulses (each followed by a pulse from clock source 208) supplied to terminal 270. Thereby, initially a binary 1 level is applied to isolation lead 228.16.

After 16 shift pulses, there is a binary 1 to 0 transition on lead 228.16 and a binary 0 to 1 transition is applied by the second stage of shift register 234 to lead 228.32. The binary 1 level remains on lead 228.32 until 32 shift pulses have been supplied to terminal 270. Operation continues in this manner for leads 228.48 and 228.64 unless a reset pulse is derived by detector 56 before the 64th shift pulse is derived.

A flow diagram for the operation of sequencer 232 is illustrated in FIG. 6. Sequencer 232 is activated sequentially and responds to the inputs thereof to derive the set-group, I-shift, and $C_{RST}$ outputs which are respectively applied to gates 238.1–238.4, the SE input of shift register 234 and the RST input of counter 220. In response to the reset input of sequencer 232 being supplied with a pulse from phase change detector 56, the sequencer is activated to idle state 252. The next pulse from clock 208 activates sequencer 232 to decision point 254 when a determination is made as to whether a binary 1 level is at the TC output of counter 220; a binary 1 at the TC output of counter 220 indicates that the counter is in its final state. If counter 220 is in its final state, sequencer 232 advances to "set-group" state 256, during which the sequencer supplies binary 1 levels in parallel to each of AND gates 238.1–238.4. The next clock pulse advances sequencer 232 to state 258. In state 258, sequencer 232 supplies a binary 1 level through OR gate 230 to the RST input of counter 220. The next pulse from clock source 208 advances sequencer 232 to decision point 260 when a determination is made as to whether a shift pulse is being supplied to control unit 206. If there is a shift pulse, the sequencer advances to state 262. In state 262, sequencer 232 supplies an "I-shift" pulse to the shift enable input of shift register 234. In response to the next clock pulse, sequencer 232 returns to idle state 252 and the cycle is repeated in response to the next set of clock pulses.

If at decision point 254 sequencer 232 determines that counter 220 is not in its final state, the sequencer stays in idle state 252. The sequencer stays in state 252 until a binary 1 level is at the TC output of counter 220, to indicate that the counter is in the final state. In response to decision point 260 determining that no shift pulse is being supplied to sequencer 232, sequencer 232 stays in state 258 and continuously resets counter 220 to the initial condition. Sequencer 232 stays in state 258 until a shift pulse is supplied to the sequencer via terminal 270.

In the reset state, binary 1 levels are supplied by control unit 206 to the terminal 228 of each of delay units 200.1–200.64, except for terminals 228 of delay units 200.32, 200.48 and 200.64. In the reset state, leads 226.1–226.4 supply binary 1 levels to AND gates 224.1–224.4, respectively, and counter 220 is activated so that a binary 1 is derived on each of output leads 222.1–222.15 thereof and the binary 1 in the first stage of shift register 234 is coupled to lead 228.16 connected to input terminal 228 of delay unit 200.16. Thereby, clock pulses from source 208 at terminal 212 are delayed in propagating from terminal 212 to terminal 210 by the delay time associated with delay unit 200.1.

The delay of delay unit 200.1 between terminals 212 and 210 for the pulses of clock source 208 is maintained until shift pulse 1 is supplied to count enable input (CE) of counter 220 and to an input of sequencer 232. In response to shift pulse 1 being followed by the leading edge of the next clock pulse from source 208, the state of counter 220 is incremented by a count 1. This causes the binary level at terminals 228 of delay units 200.1, 200.17, 200.33 and 200.49 to change from a binary 1 to a binary 0 state, while the binary level at the terminals 228 of the remaining delay units are unchanged. The change from a binary 1 to a binary 0 state at control terminals 228 of delay units 200.17, 200.33 and 200.49 has no effect on the delay imposed by delay circuit 198 on the output of clock 208. This is because an isolation level "1" is applied to lead 228.16 to open switch 202.16 and disconnect all of delay units 200.17–200.64 from delay units 200.1–200.16 that are effectively in the circuit.

With delay units 200 set as stated, pulses from clock source 208 are delayed by the delay time of delay units 200.1 and 200.2. The binary 0 level applied to control terminal 228 of delay unit 200.1 prevents coupling of the pulse from clock source 208 through OR gate 213 of delay unit 200.1. The binary 1 level applied to control terminal 228 of delay unit 200.2 causes the pulse from clock source 208 to be coupled, with the delay time associated with delay unit 200.2, through OR gate 213 and AND gate 215 to terminal 216 of delay unit 200.2. The pulse at output terminal 216 of delay unit 200.2 is coupled to terminal 217 of delay unit 200.1, thence to output terminal 216 of delay unit 200.1 with an interposed delay of delay unit 200.1. Thereby, the clock pulse from source 208 is coupled from terminal 212 to terminal 210 with the combined interposed delays of delay units 200.1 and 200.2.

Operation continues in this manner for delay units 200.1–200.15 in response to counter 220 being incremented by the first 15 successive shift pulses. At this point the counter reaches its final state. This causes a binary 1 level to be supplied by the TC output of counter 220 to sequencer 232 to advance the sequencer to "set-group" state 256 in response to a pulse from clock source 208. With sequencer 232 in state 256, a binary 1 level is supplied by the sequencer in parallel to each of AND gates 238.1–238.4.

In response to the next clock pulse from source 208, sequencer 232 advances to reset state 258, to reset counter 220 to the initial condition of a binary 1 level being in all stages of the counter, so that binary 1 levels are supplied to each of leads 222.1–222.15. The next pulse from clock source 208 advances sequencer 232 to decision point 260, where it detects the presence or absence of a shift pulse at terminal 270. In response to shift pulse 16, sequencer 232 advances to state 262 and supplies a binary 1 level to shift enable (SE) input of shift register 234. This causes a binary 1 level to be loaded into the second stage of the shift register, while each of stages 1, 3 and 4 of the shift register is loaded with a binary 0.

While sequencer 232 is in state 256 as a result of counter 220 being sequenced in response to 15 shift pulses, flip-flop 236.1 is set to 1, causing the level on lead 226.1 to change from a binary 1 to a binary 0. This change occurs because the binary 1 state of the first stage of shift register 234 is coupled through AND gate 238.1 to flip-flop 236.1. In response to the level on lead 226.1 being at the binary 0 level, AND gate 224.1 is disabled and binary 0 levels are applied to input terminals 228 of delay units 220.1–220.15 until the next reset pulse is derived by detector 56.

A binary 1 level is applied to input terminal 228 of delay unit 200.16 until shift pulse 16 is applied to control unit 206, followed by a clock pulse. This is because the first stage of shift register 234 remains in a binary 1 state during the interval of shift pulses 1–15. Shift pulse 16 and the following clock pulse from source 208 cause the first stage of shift register 234 to change from the binary 1 state to the binary 0 state. At the same time the second stage of the shift register is loaded with a binary 1, while the remaining stages of the shift register are loaded with binary 0 states. This causes a binary 1 to 0 transition on lead 228.16 so delay unit 200.16 is inserted between terminals 212 and 210. The total delay time between terminals 212 and 210 for the pulses of clock source 208 becomes the combined delay times of delay units 200.1–200.16. After operation 262, sequencer 232 is activated by the next clock pulse from source 208, to return to idle state 252.

Hence, after the 16th shift pulse has been supplied to sequencer 232 and counter 220, followed by the next pulse from clock source 208, binary 0 levels are supplied to the control terminals 228 of delay units 200.1–200.16. At this time, binary 1 levels are supplied by flip-flops 236.2–236.4 to AND gates 224.2–224.4, respectively, and by counter 220 to leads 222.1–222.15. Thereby, binary 1 levels are supplied to input terminals 228 of delay units 200.17–200.64, except for delay units 200.48 and 200.64 which are supplied with binary 0 levels.

Operation continues in the stated manner for the remaining delay units 200.17–200.64 in response to shift pulses 17–64, until a reset pulse is supplied by phase change detector 56 to control unit 206. In many instances, a reset pulse is supplied by phase change detector 56 to control unit 206 considerably prior to the level at terminal 228 of control unit 200.64 changing from a binary 1 to a binary 0 level. The time when the reset pulse is derived, relative to the change of state at a particular delay unit 200, is random and variable, as a function of manufacturing tolerances, temperature and supply voltage of the delay units. In any event, it is necessary for the total delay time of delay units 200.1–200.64, when cascaded together, to exceed the period between adjacent pulses of clock source 208. In response to the reset pulse from phase change detector 56, counter 220, sequencer 232, shift register 234 and flip-flops 236.1–236.4 are activated to the initial conditions, previously described. The sequence then begins anew in response to the next shift pulse at terminal 270.

While there have been described and illustrated specific embodiments of the invention, it will be clear that variations in the details of the embodiments specifically illustrated and described may be made without departing from the true spirit and scope of the invention as defined in the appended claims.

What is claimed is:

1. A method of discretely changing the phase of a clock as a function of time comprising deriving a signal having at least several discrete changing values as a function of time, establishing at least several discrete delay times for the clock, responding to at least several of the values of the signal to subject the clock to at least several of the established discrete delay times so there is a correspondence between the discrete delay times to which the clock is subjected and the changing values of the signal so the clock as subjected to the delays is discretely phase shifted, resetting the delay to which the clock is subjected to an initial value in response to the phase of the delay subjected clock being shifted through an integral multiple of about one cycle of the clock.

2. The method of claim 1 wherein said initial value is equal to zero.

3. A method of discretely changing the phase of a clock as a function of time comprising deriving a signal having at least several discrete changing values as a function of time, establishing at least several discrete delay times for the clock, responding to at least several of the values of the signal to subject the clock to at least several of the established discrete delay time so there is a correspondence between the discrete delay times to which the clock is subjected and the changing values of the signal so the clock as subjected to the delays is discretely phase shifted, establishing the at least several discrete delay times by applying the clock to at least several cascaded delay units having discrete delay times, the responding step being performed by changing the number of the cascaded delay units connected to the clock so that as the signal value changes, the cascaded delay units are connected to and disconnected from the clock.

4. Apparatus for shifting the phase of a periodic waveform in response to the value of a control signal, the phase shift being interposed between an output terminal of a source of the waveform and another output terminal, comprising at least several delay units having discrete delay times, and a controller responsive to the value of the control signal for controlling connections of the delay units between the waveform source output terminal and the another output terminal so that as the value of the control signal changes there are corresponding changes in the delay time interposed by the delay units on the periodic waveform between the waveform source output terminal and the another output terminal, the delay units being cascaded with each other, the controller responding to the value of the control signal for effectively controlling the number of the delay units cascaded between the source output terminal and the another output terminal so that as the value of the control signal changes there are corresponding changes in the number of the delay units effectively cascaded between the output terminals, the controller selecting an output of one of the delay units and coupling it to the another output terminal, the controller resetting the phase at the another output terminal in response to the phase at the another terminal shifting by approximately an integral multiple of a cycle of the periodic waveform.

5. Apparatus for shifting the phase of a periodic waveform in response to the value of a control signal, the phase shift being interposed between an output terminal of a source of the waveform and another output terminal, comprising at least several delay units having discrete delay times, and a controller responsive to the value of the control signal for controlling connections of the delay units between the waveform source output terminal and the another output terminal so that as the value of the control signal changes there are corresponding changes in the delay time interposed by the delay units on the periodic waveform between the waveform source output terminal and the another output terminal, the delay units being cascaded with each other, the controller responding to the value of the control signal for effectively controlling the number of the delay units cascaded between the source output terminal and the another output terminal so that as the value of the control signal changes there are corresponding changes in the number of the delay units effectively cascaded between the output terminals, the controller selecting an output of one of the delay units and coupling it to the another output terminal, the controller including a multiplexer having a first input terminal responsive to the control signal for selecting an output of one of the delay units and coupling it to the another output terminal, the multiplexer having 1,2 . . . N signal input terminals respectively responsive to 1,2 . . . N delayed replicas of the wave at output terminals of delay units 1,2 . . . N, the delay time of the delayed replica at input terminal k exceeding the delay time of the delayed replicas at input terminals 1,2 . . . (k–i), where k is respectively each of 2 . . . N, the control signal to which the multiplexer is responsive being an M bit digital reflected coded signal having a value indicating the phase shift to be introduced between the waveform source output terminal and the another output terminal, the another output terminal being an output terminal of the multiplexer, the multiplexer including (N–1) gates each having: (a) first and second signal inputs, (b) a signal output and (c) a control input responsive to a bit of the reflected coded signal for routing the signal at one of the two signal inputs to the signal output as a function of the bit value at the control input; the signal inputs and signal outputs of the gates being connected to (a) each other, (b) the multiplexer input terminals and (c) the multiplexer output terminal and the control inputs of the gates being connected to be responsive to the M bits of the M bit digital reflected coded signal so that, as the reflected signal value changes from a reflected value representing the value in base 10 of i to (i+1), the signal at the multiplexer output terminal changes from the signal at multiplexer input terminal i to the signal at multiplexer input terminal (i+1), where i is selectively each of 0, 1, 2 . . . (N–2).

6. Apparatus for shifting the phase of a periodic waveform in response to the value of a control signal, the phase shift being interposed the phase shift being interposed between an output terminal of a source of the waveform and another output terminal, comprising at least several delay units having discrete delay times and a controller responsive to the value of the control signal for controlling connections of the delay units between the waveform source output terminal and the another output terminal so that as the value of the control signal changes there are corresponding changes in the delay time interposed by the delay units on the periodic waveform between the waveform output terminal and the another output terminal, the delay units being cascaded with each other, the controller responding to the value of the control signal for effectively controlling of the delay units cascaded between the source output terminal and the another output terminal so that as the value of the control signal changes there are corresponding changes in the numbers of the delay time units effectively cascaded between the output terminals 1, 2. . . N of said delay units being provided, delay unit 1 being connected so an output thereof is connected to said another output terminal without connections through any other of said N delay units, the controller controlling connections between input and output he terminals of the delay units and between the source output terminal and the input terminal of said delay unit 1 so that in response to the control signal having a value commanding k of said delay units to be cascaded between the source output terminal and the another output terminal the input terminal of delay unit K is connected to the source output terminal without connections through any other of said N delay elements, and the output terminal of delay unit j is connected to the input terminal of delay unit (j–1) where k is selectively any integer between 2 and N and j is selectively every integer between 2 and k.

7. The apparatus of claim 6 wherein a wave is derived at the another output terminal and the controller resets the value of k in response to the wave at the another output terminal differing in phase from the wave at the source output terminal by an integral multiple of one cycle of the phase of one of the waves.

8. The apparatus of claim 6 wherein the controller establishes a connection between delay units k and (k–1) before breaking a connection between an input of delay unit (k–1) and the waveform source terminal in response to the number of delay units interposed between the source output terminal and the another output terminal changing from k to (k-1).

9. Apparatus for shifting the phase of a periodic waveform in response to the value of a control signal, the phase shift being interposed between an output terminal of a source of the waveform and another output terminal, comprising at least several delay units having discrete delay times, and a controller responsive to the value of the control signal for controlling connections of the delay units between the waveform source output terminal and the another output terminal so that as the value of the control signal changes there are corresponding changes in the delay time interposed by the delay units on the periodic waveform between the waveform source output terminal and the another output terminal, the controll resetting the interposed delay time between the source output terminal and the another output terminal in response to the interposed delay time between the source output terminals and the another terminal shifting by approximately an integral multiple of a cycle of the periodic waveform.

10. Apparatus for shifting the phase of a periodic waveform in response to the value of a control signal, the phase shift being interposed between an output terminal of a source of the waveform and another output terminal, comprising at least several delay units having discrete delay times, and a controller responsive to the value of the control signal for controlling connections of the delay units between the waveform source output terminal and the another output terminal so that as the value of the control signal changes there are corresponding changes in the delay time interposed by the delay units on the periodic waveform between the waveform source output terminal and the another output terminal, the frequency of the periodic waveform and the value of the control signal and the apparatus being such that the number of delay units between the source output terminal and the another output terminal always changes monotonically as a function of time, the apparatus being included in a phase locked loop including an analog-to-digital converter responsive to an intelligence presenting set of bits, at least a portion of the intelligence having a tendency to be degraded, the converter deriving a multibit digital signal representing an amplitude of the intelligence in response to a sampling wave train derived in response to the shifted periodic waveform at the another output terminal, and means responsive to the converter for deriving signals representing frequency and phase errors between the intelligence and the shifted periodic waveform at the another output terminal, and the derived signal representing the phase error controlling the control signal.

11. The apparatus of claim 10 wherein the phase locked loop is included in a receiver responsive to a wave on which the intelligence is modulated.

12. Apparatus for shifting the phase of a periodic waveform in response to the value of a control signal, the phase shift being interposed between an output terminal of a source of the waveform and another output terminal, comprising at least several delay units having discrete delay times, and a controller responsive to the value of the control signal for controlling connections of the delay units between the waveform source output terminal and the another output terminal so that as the value of the control signal changes there are corresponding changes in the delay time interposed by the delay units on the periodic waveform between the waveform source output terminal and the another output terminal, the apparatus being included in a variable frequency oscillator, the apparatus further comprising: a command source for changing the frequency of the oscillator, a signal value derived by the command source being 0 for a constant frequency output of the oscillator at the another output terminal and being other than 0 for changes in the oscillator output frequency, the controlling means integrating the value derived by the command source to control the amount of the delay time interposed by the delay units on the periodic waveform.

13. Apparatus for shifting the phase of a periodic waveform in response to the value of a control signal, the phase shift being interposed between an output terminal of a source of the waveform and another output terminal, comprising at least several delay units having discrete delay times, and a controller responsive to the value of the control signal for controlling connections of the delay units between the waveform source output terminal and the another output terminal so that as the value of the control signal changes there are corresponding changes in delay time interposed by the delay units on the periodic waveform between the waveform source output terminal and the another output terminal, delay units as a whole having a reset state, the controller monotonically changing, from the reset state, the delay time interposed by the delay units on the periodic waveform as a function of time and resetting the interposed delay time to the reset state in response to the phase at the another terminal being shifted through approximately an integral multiple of a cycle of the periodic waveform.

14. Apparatus for shifting the phase of a periodic waveform in response to the value of a control signal, the phase shift being interposed between an output terminal of a source of the waveform and another output terminal, comprising at least several delay units having discrete delay times, and a controller responsive to the value of the control signal for controlling connections of the delay units between the waveform source output terminal and the another output terminal so that as the value of the control signal changes there are corresponding changes in delay time interposed by the delay units on the periodic waveform between the waveform source output terminal and the another output terminal, N of said delay units being provided so there is a possibility of N different discrete time delays the controller responding to the value of the control signal to selectively connect k of said N delay elements in cascaded relation with each other between the waveform source output terminal and the another output terminal while decoupling the remaining (N–k) delay units from the k cascaded units, where N is an integer and k is selectively every integer from 1 to N.

15. The apparatus of claim 14 wherein the controller divides the N elements into plural groups, the controller monotonically changing the value of k from 1 to P for a first group of P of the N elements during a first time interval, and then monotonically changing the value of k from 1 to Q for a second group of Q of the elements during a second time interval, where P and Q are integers less than N.

16. The apparatus of claim 15 wherein the controller includes a counter having P states that are sequenced from 1 to P, and a coupler for coupling control signals indicative of which of the P states the counter is in from the counter to the first group of P elements during the first time interval and for coupling control signals indicative of which of the Q states the counter is in from the counter to the second group of Q elements during the second time interval, where Q is no greater than P.

17. Apparatus for shifting the phase of a clock in response to a control signal representing frequency corrections to be applied to the clock comprising means responsive to the clock for delaying the clock by at least several different discrete time delays, and control means responsive to the value of the frequency correction signal for coupling the clock as delayed by the discrete time delays to an output terminal so that when the value of the frequency correction is not zero there are corresponding changes in the discrete time delays of the clock at the output terminal and when the value of the frequency correction is zero, the phase of the delayed clock at the output terminal does not change and is susceptible of having all of the discrete time delays, the frequency correction signal being very small to thereby change the phase of the delayed clock at the output terminal relative to the clock as applied to the delay circuit after many cycles of the clock have occurred.

18. The apparatus of claim 17 further including means responsive to the phase of the delayed clock at the output terminal shifting through approximately an integral multiple of one cycle of the clock for resetting the control signal so the delayed clock at the output terminal has a predetermined initial phase relative to the clock as applied to the delay circuit.

19. Apparatus for shifting the phase of a clock in response to a control signal representing a phase change to be applied to the clock comprising a circuit responsive to the clock for deriving at lest several replicas of the clock, the replicas having different time delays with respect to each other, and a coupler responsive to the phase change representing signal for coupling a selected one of the replicas to an output terminal as a function of the value of the control signal, and a resetter for resetting the control signal to a predetermined value when the replica at the output terminal has shifted through an integral multiple of about one cycle of the clock.

20. The apparatus of claim 19 wherein the phase change representing signal is a phase correction signal derived in response to a signal representing a substantially constant frequency error between the replica at the output terminal and a reference frequency, the predetermined value of the control signal being set to a value associated with a phase delay of 0° for the clock when the replica at the output terminal has a phase that differs by approximately P×360° from the phase of the clock after being supplied to the output terminal, where P is an integer.

21. The apparatus of claim 20 wherein the coupler has finite propagation delay, the resetter for the control signal including means for detecting a simultaneous occurrence of like transitions in the selected replica at the output terminal and a replica of the clock as delayed by the propagation delay.

22. Apparatus for shifting the phase of a clock in response to a control signal representing a phase change to be applied to the clock comprising a circuit responsive to the clock for deriving at least several replicas of the clock, the replicas having differing time delays with respect to each other, and a coupler responsive to the phase change representing signal for coupling a selected one of the replicas to an output terminal as a function of value of the control signal, the apparatus being included in a phase locked loop including an analog-to digital converter responsive to symbols to be sampled by the converter, at least a portion of the symbols having a tendency to be degraded, the converter deriving a multi-bit digital signal representing an amplitude of one of the symbols in response to a sampling wave train derived in response to the selected replica at the output terminal, and a signal deriver responsive to the converter for deriving signals representing a frequency error and phase correction of the symbols as applied to the converter relative to the selected replica, the derived phase correction signal being the control signal.

23. The apparatus of claim 22 wherein the signal deriver integrates the frequency error representing signal derived from the converter to derive a signal representing an integrated frequency error derived from the converter.

24. The apparatus of claim 23 further including a counter responsive to the signal representing the integrated frequency error derived from the converter for deriving the phase correction signal, the counter being reset to zero in response to detection of the selected replica at the output terminal being shifted through an integral multiple of one cycle of the clock.

25. The apparatus of claim 24 wherein the counter derives a reflected coded control signal having M bits for controlling the coupler, the replica being derived by a circuit including a multiplexer, the multiplexer having N signal input terminals designated $0, 1, 2 \ldots (N-i)$ respectively responsive to replicas of the clock having delay times of approximately 0, DT, 2DT $\ldots$ $(N-1)$DT, where DT is a delay time, the multiplexer including $(N-1)$ gates each having: (a) first and second signal inputs, (b) a signal output and (c) a control input responsive to a bit of the reflected coded signal for routing the signal at one of the two signal inputs to the signal output as a function of the bit value at the control input; the signal inputs and signal outputs of the gates being connected to each other, the multiplexer input terminals and the multiplexer output terminal and the control inputs of the gates being connected to be responsive to the M bits of the control signal so that, as the reflected signal value changes from a reflected value representing value in base 10 of i to (i+1), the signal at the multiplexer output terminal changes from the signal at multiplexer input terminal i to the signal at multiplexer input terminal (i+1), where i is selectively each of $0, 1, 2 \ldots (N-2)$.

26. Apparatus for shifting the phase of a clock in response to a control signal representing a phase change to be applied to the clock comprising a circuit responsive to the clock for deriving at least several replicas of the clock, the replicas having differing time delays with respect to each other, and a coupler responsive to the phase change representing signal for coupling a selected one of the replicas to an output terminal as a function of the value of the control signal, the coupler when switched in response to the phase change control signal having a tendency to derive a glitch at the output terminal, and a circuit coupled to the output terminal for preventing the coupling of the glitches to the output terminal.

27. Apparatus for shifting the phase of a clock in response to a control signal representing a phase change to be applied to the clock comprising a circuit responsive to the clock for deriving at least several replicas of the clock, the replicas having differing time delays with respect to each other, and a counter responsive to the phase change representing signal for coupling a selected one of the replicas to an output terminal as a function of the value of the control signal, the replica deriving means including $(N-1)$ cascaded substantially equal time delay elements designated $1, 2 \ldots (N-1)$ and the coupler for coupling including a multiplexer having N input terminals designated $0, 1, 2 \ldots (N-2)$, input terminal 0 being responsive to the clock, input terminal k being responsive to the replica derived from delay element k, where k is selectively each of $1, 2 \ldots (N-1)$, the multiplexer including another input responsive to the control signal and the output terminal, the phase change signal being reflected coded, the multiplexer including an array of $(N-1)$ gates each having: first and second signal inputs, a signal output and a control input responsive to a bit of the reflected coded signal for routing the signal at one of the two signal inputs to the signal output as a function of the bit value at the control input.

28. Apparatus for shifting the phase of a clock in response to a control signal representing a phase change to be applied to the clock comprising a circuit responsive to the clock for deriving at least several replicas of the clock, the replicas having differing time delays with respect to each other, and a coupler responsive to the phase change representing signal for coupling a selected one of the replicas to an output terminal as a function of the value of the control signal, the coupler including a multiplexer having a signal output terminal, N signal input terminals designated by $0, 1, 2, \ldots (N-1)$, the multiplexer being responsive to a reflected coded signal having M bits where $2^M=N$, where N is an integer greater than 2, the multiplexer including: $(N-1)$ gates each having first and second signal inputs, a signal output and a control input responsive to a bit of the reflected coded signal for routing the signal at one of the two signal inputs to the signal output as a function of the bit value at the control input; the signal inputs, signal outputs, signal input terminals and control inputs and the M bits being coupled together so that, as the reflected signal value changes from a reflected value representing the value in base 10 of i to (i+1), the signal at the output terminal changes from the signal at input terminal i to the signal at input terminal (i+1), where i is selectively each of $0, 1, 2 \ldots (N-2)$.

29. The apparatus of claim 28 wherein the $(N-1)$ gates are spatially arranged as a tree including M rows such that row r includes $N(2^{-r})$ gates, where r is selectively each of $1, 2 \ldots M$.

30. The apparatus of claim 29 wherein the first and second inputs of gate k (where k is an even integer from 0 to N/2−2) in row 0 are respectively connected to be responsive to the signals at input terminals $2k$ and $(2k+1)$ and the first and second inputs of gate (k+1) in row 0 are respectively connected to be responsive to the signals at input terminals $(2k+3)$ and $2(k+1)$ and the first and second inputs of gate j (wherein j is an even integer from 0 to $N(2^{-(r+1)}-2)$) in row r+1are respectively connected to be responsive to the signals at the output terminals of gates $2j$ and $2j+1$ of row r and the first and second inputs of gate (j+1) in row r+1 are respectively connected to be responsive to the signals at the output terminals of gates $(2j+3)$ of row r, where r is selectively each of 0 to (M−1).

31. A method of attaining phase lock between a constant frequency input and a clock having a frequency slightly different from the constant frequency comprising sampling the amplitude of the input at a sampling frequency, responding to the sampled amplitude to derive a first representation having a value equal to a frequency error between the sampling frequency and the constant frequency input, shifting the frequency of the clock by an amount determined by the value of the first representation by integrating the first representation to derive a second representation having a value commensurate with a phase shift be imposed on the clock, the phase shift to be imposed having one of at least several different discrete values, adjacent ones of said phase shift values being approximately equally spaced from each other, and imposing a delay on the clock for a time directly proportional to a selected one of the discrete values to derive the frequency shifted clock.

32. The method of claim 31 wherein the delay is imposed by deriving at least several replicas of the clock such that adjacent replicas k are time delayed from each other by approximately the same amount, and selecting the replica that is phase shifted from the clock by an amount determined by the value of the second representation.

33. The method of claim 31 wherein the delay is imposed by applying the clock to at least several delay units having discrete delay times, and changing the number of the delay units which impose delays on the clock and the selected discrete value changes.

34. The method of claim 31 further comprising resetting the imposed phase shift to 0 in response to the imposed delay on the clock being shifted through an integral multiple of about one cycle of the clock.

35. A method of shifting the phase of a clock to a selected one of at least several different discrete values, comprising imposing a delay on the clock for a time determined by the selected discrete value to derive the phase shifted clock so that as the selected value changes the imposed delay changes, and resetting the selected value to 0 in response to the imposed delay in the clock being shifted through an integral multiple of about one cycle of the clock.

36. The method of claim 35 wherein the delay is imposed by deriving at least several replicas of the clock, each replica having a different delay time relative to the clock, and responding to the selected discrete value to select one of the replicas.

37. The method of claim 35 wherein the delay is imposed by applying the clock to at least several delay units having discrete delay times, and changing the number of the delay units which impose delays on the clock and the selected discrete value changes.

38. A method of discretely changing the phase of a clock as a function of time, possibly by amounts in excess of multiples of 360°, comprising:

converting a value representing a desired phase delay of the clock into a signal having at least several discrete values that change as a function of time, incrementing the discrete value of the signal at a certain rate for very unit of desired phase delay change in a cycle of the clock, establishing at least several discrete delay times for the clock, selecting one of the at least several discrete delay times of the clock in response to the discrete value of the signal so there is a correspondence between the discrete delay times to which the clock is subjected and the changing values of the discrete signal, delaying the clock by the selected discrete delay time to derive a delay subjected clock, and resetting the discrete value of the signal to a predetermined value in response to the phase of the delayed subjected clock changing over approximately an integral multiple of 360° of the phase of the clock.

39. The method of claim 38 wherein the discrete value of the signal is reset to zero.

40. A method of changing a clock wave having a predetermined fixed frequency to derive an output wave comprising deriving a digital control signal having a value that varies in response to the relative phase of a constant frequency input signal and the output wave, subjecting the clock wave to at least several discrete delays so there are derived at least several waves having differing time positions that are replicas of the clock wave, Subjecting the clock wave to at least several discrete delays so there are derived at least several waves having differing time positions that are replicas of the clock wave, selecting one of the waves having differing time positions in response to the values of the digital control signal to derive the output wave, and resetting the value of the digital control signal to a predetermined initial value therefor each time output wave changes phase relative to the clock wave by approximately 360° due to a lead/lag change in the phase relationship of the output wave and clock wave.

41. The method of claim 40 wherein the output wave and input signal are such that the digital control signal value changes monotonically between resets.

42. Apparatus for changing a clock wave having a predetermined fixed frequency to derive an output wave comprising means for deriving a digital control signal having a value that varies in response to the relative phase of a constant frequency input signal and the output wave, means for subjecting the clock wave to at least several discrete delays so there are derived at least several waves having differing time positions that are replicas of the clock wave, means for selecting one of the waves having differing time positions in response to the value of the digital control signal to derive the output wave, and means for resetting the control signal to a predetermined initial value therefor each time the output wave changes phase relative to the clock wave by approximately 360° due to a lead/lag change in the phase relationship of the output wave and clock wave.

* * * * *